United States Patent [19]
Fima et al.

[11] Patent Number: 4,710,668
[45] Date of Patent: Dec. 1, 1987

[54] VIBRATING STRING RESONATOR

[75] Inventors: Henri Fima, Malissard; Denis Janiaud, Les Ulis, both of France

[73] Assignees: Crouzet, Paris; Office National D'Etudes et de Recherche Aerospatiales (O.N.E.R.A.), Chatillon, both of France

[21] Appl. No.: 803,160

[22] Filed: Dec. 2, 1985

[30] Foreign Application Priority Data

Dec. 4, 1984 [FR] France .................. 84 18587

[51] Int. Cl.⁴ .......................................... H01L 41/08
[52] U.S. Cl. .................................... 310/323; 310/321
[58] Field of Search .............. 310/321, 323, 324, 338, 310/367, 368, 361, 25, 330–332; 73/777, 778, 781, 141 R, DIG. 1, DIG. 4; 357/26; 338/2, 47

[56] References Cited

U.S. PATENT DOCUMENTS

| 3,470,400 | 9/1969 | Weisbord | 310/323 X |
| 3,479,536 | 11/1969 | Norris | 310/323 |
| 4,215,570 | 8/1980 | Eer Nisse | 310/338 X |
| 4,321,500 | 3/1982 | Paros et al. | 310/321 |
| 4,445,065 | 4/1984 | Albert | 310/321 |
| 4,446,394 | 5/1984 | Albert | 310/321 |
| 4,656,383 | 4/1987 | Albert | 310/321 |
| 4,658,174 | 4/1987 | Albert | 310/323 |
| 4,658,175 | 4/1987 | Albert | 310/323 |

FOREIGN PATENT DOCUMENTS 1442041 7/1965 France .
2080814 11/1971 France .

OTHER PUBLICATIONS

Prior Art of Single Isolator Beam Resonator by W. C. Albert, The Singer Co., Fairfield, N.J. 07006, 1978, (12 pages).
Force Sensing Using Quartz Crystal Flexure Resonators by William C. Albert, The Singer Co., Fairfield, N.Y. 07006, (1984 IEEE), pp. 233–239.
Vibrating Quartz Crystal Beam Accelerometer by William C. Albert, The Singer Co., Fairfield, N.J. 07006, ISA; 1982, pp. 33–43.
Technical Report on the Quartz Resonator Digital Acceletometer by Norman R. Serra, Litton Systems, Inc., Woodland Hills, CA, pp. 487–516, May 1968.

Primary Examiner—Mark O. Budd
Attorney, Agent, or Firm—Stevens, Davis, Miller & Mosher

[57] ABSTRACT

The invention provides a string resonator vibrating under flexion whose oscillation is maintained by piezoelectric, electrostatic or magnetic exitation means.

Decoupling is obtained by inertia masses which oscillate in the vibration plane of the string, between the string and fixing supports, with a movement of rotation about an axis orthogonal to the vibration plane of the string and at the level of flexible elements. The resonator is easy to manufacture, inexpensive and hase a good coefficient of quality. It may be used for force, pressure sensors or gyroscopes.

11 Claims, 14 Drawing Figures

VIBRATING STRING RESONATOR

BACKGROUND OF THE INVENTION

1. Field of the Invention

The present invention relates to a resonator of the string or beam type vibrating under flexion and comprising fixing means at at least one end and inertia mass vibratory decoupling means disposed between the string and the fixing means for preventing mechanical vibratory energy from being transferred between said string and its fixing means.

2. Description of the Prior Art

Resonators of this type are excited and kept oscillating by different means, for example electromagnetic, electrostatic, piezoelectric, on one of their natural frequencies.

Such resonators are used as sensitive elements for forming:

force, pressure, acceleration or temperature sensors when they are subjected to axial forces, stable oscillators, gyrometers or gyroscopes.

The final qualities of such devices are all the greater the better the confinement of the mechanical vibratory energy in the string, i.e. the more the dissipation of energy to the mounts is reduced. This may be obtained by defining efficient decoupling structures avoiding draining off by the supports of a part of the mechanical energy.

For that numerous resonators have already been proposed.

One of the first mountings proposed, such as described in the U.S. Pat. No. 3 479 536 (NORRIS), comprises no vibratory decoupling element but, on the other hand, provides for thinned down portions of the fixing elements allowing rotation about axes parallel to the vibration plane for reducing the non axial stresses which might be created because of a poor alignment of the supports.

The same patent also teaches vibratory decoupling using a method of fixing the vibrating string by its nodal lines. This reduces energy losses. The connecting points are reduced to a minimum between the string and the supports at the level of the nodal lines, by a special cutting of the resonator. This material connection nevertheless introduces an inevitable angular stiffness and thus causes and transmits torques at the level of the nodal lines, which causes an exchange of energy with the outside resulting in a certain vibratory energy loss. Moreover, this type of resonator has the disadvantage, when it is used for force sensors, that the forces transmitted to the string from fixing zones provided at each end are not distributed homogeneously over the whole of the string, which causes appreciable movements of the nodal vibration points, depending on the forces exerted and so deteriorates the vibratory decoupling.

It is also known to form symmetric resonators, in the form of a tuning fork, constituted by two identical strings. In theory this configuration is perfect but in practice it requires adjustments of form and mass which it is only possible to provide for a fixed frequency resonator and which cannot be envisaged for resonators having a large range of usable frequencies. Such a construction is proposed in the U.S. Pat. No. 4 215 570 (NISSE).

Finally, another decoupling means may be obtained by inertia effect. It consists in inserting inertia masses between the string and its fixing ends. Decoupling of this type is described in the U.S. Pat. No. 3 470 400 (WEISBORD), which recommends using two U shaped inertia masses at each end of the string. These masses are further each connected to fixing means by means of two flexible blades, functioning in a deformable parallelogram. Thus the decoupling is obtained by the translational movement of the masses following a reciprocal movement in the vibration plane of the string and in phase opposition with respect thereto.

Such decoupling, with complex geometry, involves very reduced dimensional tolerances for eliminating the complex parasite movements of the masses. Now these movements result in compression and extension forces on the blades of the deformable parallelogram and so in appreciable energy losses, transmitted to the fixing points. To attenuate the forces applied to the connecting blades it has been proposed to artificially reduce the stiffness thereof under traction-compression, by modifying the structure, for example, by inserting between the blades and the masses other blades perpendicular to the first ones.

The construction of such transducers involves machining, carried out more particularly by ultrasonic techniques, which requires several successive operations in which different tools are used for rough machining the blanks, machining the shapes and adjusting the sizes. These operations, which require previous adjustments for each of the tools, leads to a very high manufacturing cost.

SUMMARY OF THE INVENTION

The aim of the invention is to avoid the disadvantages of the prior art resonators, by proposing a simplified geometry which solves the problems of confinement of the mechanical energy of the vibrating string and the conservation of its overvoltage coefficient and which provides a considerable saving in machining time and manufacturing cost without resulting in a loss of the qualities usually required for such resonators. For this, the invention provides a resonator of the above defined type in which each inertia mass is mounted for oscillating in the vibration plane of the string, with a rotational movement about an axis orthogonal to the plane of vibration of the string.

The resonator of the invention may comprise two decoupling masses integrally secured to the ends of the string and each connected to a fixing element, each mass being connected to the corresponding fixing element by a rotationally flexible element and being driven with a rotational movement in response to the vibrational movement of the string, the rotational axis of each mass being perpendicular to the vibration plane of the string and situated at the level of the flexible elements In a preferred embodiment of the invention, the masses, in the vibration plane of the string, have a convex contour such as that of a rectangle or an ellipse for example, and are adapted so that their natural resonance frequency is substantially higher than that of the vibrating string.

This decoupling means is applicable not only to a resonator fixed by both ends but also to a resonator fixed by a single end, the other end of the string remaining free.

For some applications and so as to avoid natural parasite modes due to a mass which is too great, each mass may be itself subdivided into at least two elementary masses connected together by a flexible element allowing the rotation of each elementary mass in the vibration plane of the string.

Such a method of decoupling a string vibrating under flexion, in a natural resonance mode, using compact so rigid inertia masses greatly facilitates the precise calculation of the dimensioning of the resonator and reduces the number of parameters to be taken into account, which leads to manufacturing tolerances which are not very critical. If the inertia masses are two in number, each of them is connected to the fixing elements by its face opposite the string by means of a flexible element aligned with the string and and it is driven with a rotational movement in response to the vibratorey movement of the string, the axis of rotation of the masses being perpendicluar tot he vibration plane of the string and situated at the center of rotation of the corresponding flexible element.

With such a design, uniform distribution is obtained inside the string of the longitudinal stress created by the force to be measured.

If there is only a single inertia mass, subdivided or not, as in the case of a string having a free end, the articulation is situated between said mass and the single fixing means. As before, the inertia mass oscillates in a vibration plane of the string with a rotational movement about an axis orthogonal to the vibration plane of said string.

The resonator of the invention may be made as a single piece and obtained from an homogeneous material, for example, quartz kept on one of its resonance frequencies by piezoelectric effect. Depending on the use contemplated, the vibrating element may be of rectangular, square or circular section, the section of such a string not being necessarily uniform.

In a preferred embodiment of the resonator of the invention a rectangular quartz string is used of given thickness and of dimensions corresponding to the outer dimensions of the whole of the structure. A tool is moreover formed for ultrasonic machining to the dimensions of the hollows to be created, so as to obtain the configuration of the string, of the masses, of the flexible elements and of the fixing elements. The machining is carried out in a single operation. The machining time of a resonator in accordance with the invention, with respect to the time required for machining a structure with equivalent performances such as those described above, is ten to fifteen times shorter. Furthermore, the machining tolerances may be broader. The structure of the resonator of the invention may be defined from simple calculations. Accessibility to the faces of the vibrating string is facilitated, which simplifies the complementary work such as lapping and metallization, for example for forming the piezoelectric excitation electrodes.

BRIEF DESCRIPTION OF THE DRAWINGS

The invention will be better understood from the following description of several preferred embodiments of the invention in comparison with the prior state of the art and with reference to the accompanying drawings in which.

DESCRIPTION OF THE PREFERRED EMBODIMENTS

Figure 1:
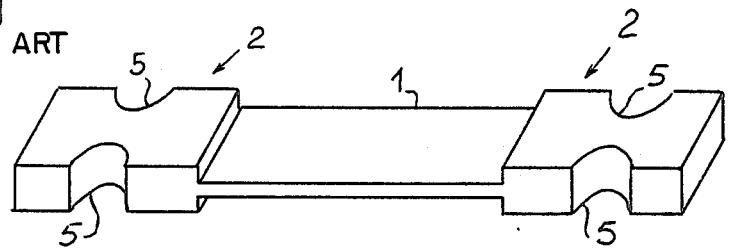
FIGS. 1 to 4 show perspective views of four different resonators of the prior art intended in particular for measuring forces.

FIG. 1 shows a NORRIS resonator comprising a vibrating element 1, of the string type, and fixing means 2. This resonator comprises no vibratory decoupling element, but only thinned down portions 5 at the level of the fixing points 2 for reducing the non axial stresses due to an alignment defect of the fixing means.

Figure 2:
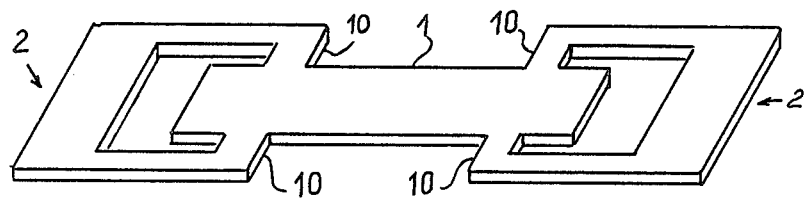

FIG. 2 shows another NORRIS resonator whose vibrating element 1 is fixed at ends 2 by its nodal points 10.

Figure 3:
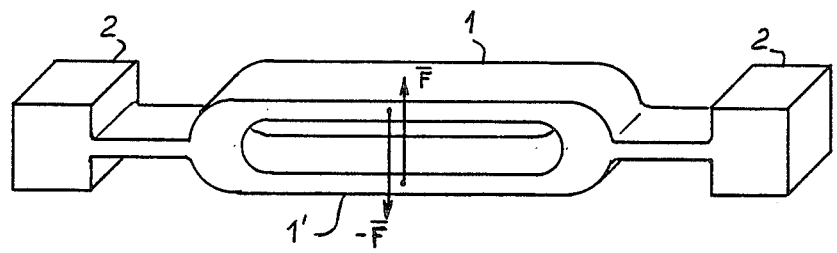

FIG. 3 shows a typical example of a resonator of the tuning fork type using two strings 1 and 1', identical and symmetrical, with two ends 2.

Figure 4:
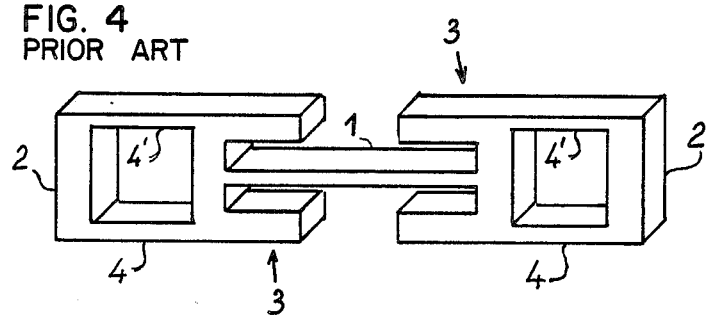

FIG. 4 is a WEISBORD resonator in which the transfer of vibratory energy is reduced by using complex inertia masses moving in translation because they are fixed to supports 2 by flexible and parallel blade articulations 4 and 4'.

In accordance with the invention the resonator comprises a vibrating beam or string 1, inertia masses 3, rotationally flexible elements or articulations 4 disposed between fixing support means 2 and the masses 3.

Mechanical decoupling of the resonator of the invention means that the string vibrates under flexion, in a natural resonance mode, in a plane containing the longitudinal axis of the string and one of the two main inertia directions of its cross section; these two main flexion planes are orthogonal.

The string is assumed to be fixed by embedment of one or of both its ends, the string being connected to the supports, through the masses, over a cross section of said string. Such embedded portions are shown by the references 6.

Figure 5A:
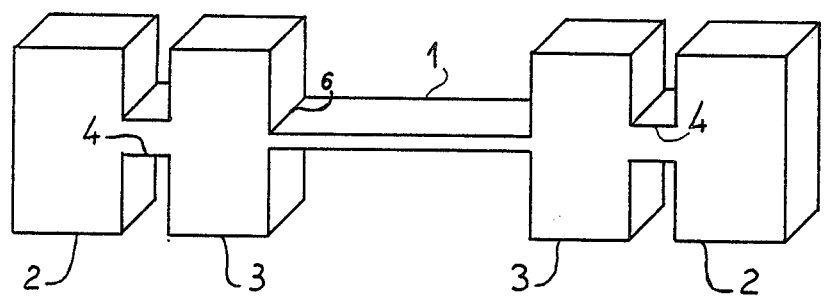
FIG. 5a shows a perspective view of one embodiment of the resonator of the invention fixed by its ends and intended principally for measuring forces or temperatures.
Figure 5B:
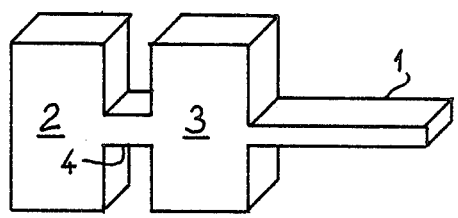
FIG. 5b shows another embodiment of the resonator of the invention fixed by only one of its ends and intended more especially for serving as frequency reference or sensitive gyrometer element.

The theory of flexion limited to small movements allows the spectrum of the natural vibration frequencies fn to be determined. This spectrum depends both on the main flexion plane chosen and on the conditions at the limits, i.e. with a string embedded at both its ends, such as shown in FIG. 5a or embedded at a single end, the other being free, such as shown in FIG. 5b. For a given spectrum, the number of the mode is referenced by a positive integer n or zero, with n=0 for the fundamental mode. The frequency fn is an increasing function of n. Furthermore, for each mode, the mechanical action exerted by the vibrating string on the support at the level of the embedment cross section may be determined. The system of forces applied is equivalent to a single, force, a sinusoidal function of time, of the form $\overline{Fo} \cos\Phi nt$, $\Phi_n$ being the pulsation of the envisaged mode n. The support of the sliding vector Fo is perpendicular to the string, situated in the flexion plane of the mean line of the string, and intersects this latter at a distance Xn from the embedment 6. Xn depends on the conditions at the limits of the string and on the number n of the mode.

Figure 6C:
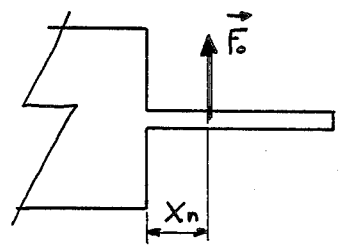
FIG. 6c is a diagram similar to those of FIGS. 6a and 6b but for a string embedded at only one end.
Figure 6A:
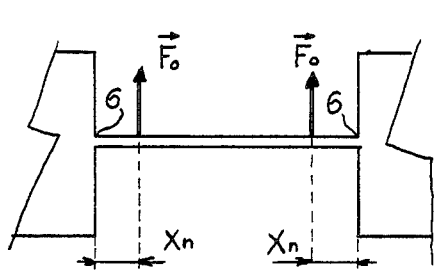
FIG. 6a is a diagram illustrating the position Xn of the force Fo equivalent to the forces generated by the string of the resonator of the invention, embedded at its ends 6, under even vibration mode operation.
Figure 6B:
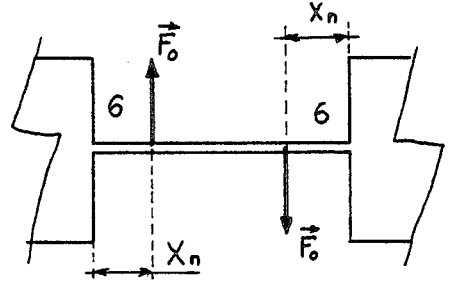
FIG. 6b is a diagram similar to that of FIG. 6a, for the same string, but under uneven vibration mode operation.

(a) Case of a string embedded at both ends (FIGS. 6a and 6b)

For each of the two main flexion planes, the natural frequencies fn form a succession whose terms vary as $(3/2+n)^2$, i.e.:

$$fn = \frac{\pi}{2L^2} \left( \frac{3}{2} + n \right)^2 \sqrt{\frac{EI}{\rho S}} \quad (1)$$

in which equation

E represents Young's longitudinal modulus, l represents the voluminal mass of the material of the string, I represents the moment of inertia of a cross section of the string with respect to its main inertia axis perpendicular to the flexion plane, S represents the area of a cross section of the string, L represents the length of the string.

The distance Xn is given by the following equation:

$$Xn = \frac{L}{\frac{3\pi}{2} + N\pi} \quad (2)$$

The equations (1) and (2) give values of fn and Xn which are approximate but all the more exact the higher n. Thus, for n=0, the equation (2) gives Xo: 0.212L whereas the exact value is 0.215L. For n≧1, the calculated value of Xn is practically exact.

The reactions of the embedments depend on the parity of the flexion mode depending on whether n is even or uneven (FIG. 6a for an even mode, FIG. 6b for an uneven mode).

(b) Case of a string embedded at only one end (FIG. 6c)

The approximate values of the natural frequencies are the same as in the preceding case, with the addition of an extra frequency corresponding to the fundamental mode n=0. We then obtain:

$$fo = \frac{(1.875)^2}{2\pi L^2} \sqrt{\frac{EI}{\rho S}}$$

$$\begin{cases} fn = \frac{\pi}{2L^2} \left( \frac{3}{2} + n - 1 \right)^2 \sqrt{\frac{EI}{\rho S}} \\ n \geq 1 \end{cases} \quad (3)$$

Similarly we obtain, for the distance Xn: Xo=0.726 L $$\begin{cases} Xn = \frac{L}{\frac{3\pi}{2} + (n - 1)\pi} \\ n \geq 1 \end{cases} \quad (4)$$

It should be noted that in the case of a string with non constant section, the above defined resonance frequency fn and the characteristic distance Xn are calculated as explained hereafter for each flexion mode.

Definition of the vibratory decoupling device

For minimizing the noise and the frequency drift of a vibrating string oscillator, it is necessary to mechanically decouple the vibrating string from its support, so as to obtain a sufficient coefficient of quality.

The mechanical decoupling is perfect if the forces and the moments applied to the support are zero, which is not the case for a simple embedded string, as was seen above.

According to the invention, the mechanical decoupling is obtained by an inertia effect by inserting between the string 1 and the fixing means 2 rigid inertia masses 3, i.e. compact and with a convex contour, which may move in rotation by means of flexible elements 4 serving as articulations articulated about an axis orthogonal to the vibration plane of the string. In the vibration plane of the string 1, the rigid masses 3 may have the form of a rectangle or an ellipse, for example.

Thus, decoupling of a string embedded at both ends, for example, so as to form a force sensor, is obtained by a one piece structure cut out from a parallelepipedic quartz block.

Figure 7:
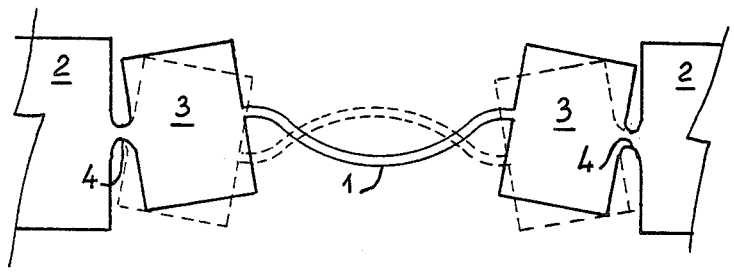
FIG. 7 is a side view of another embodiment of the resonator of the invention showing the deformations thereof for the two endmost positions of its vibratory movements.
Figure 10:
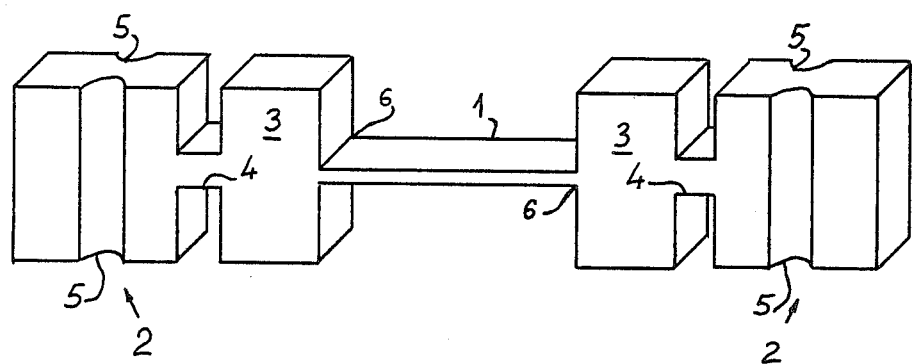
FIG. 10 shows a perspective view of another embodiment of the resonator of the invention, whose fixing means 2 comprise thinned down portions of the NORRIS type.

FIGS. 5a and 7 show one example of cutting in accordance with the invention.

String 1 vibrates under flexion in the plane of FIG. 7. It is embedded at each end in a mass 3 of rectangular shape rotated about a flexible articulation in the form of a strip 4. The two endmost parts 2 are the fixing elements which are, for example, bonded to the structural elements of the measuring assembly, not shown for simplifying the Figures. It will be noted that an inertia mass may comprise two elementary masses or more connected together by flexible elements allowing rotation of each elementary mass in the vibration plane of the string. In FIG. 7 there has been shown, with broken lines and with full lines, the structure in its endmost deformation when string 1 vibrates in the fundamental mode. The deformation of the string is greatly enlarged as well as the relative rotation of the masses.

The section of the string, in this example, is rectangular and constant, the plane of FIG. 7 being then a main flexion plane. The structure is symmetrical with respect to the mid perpendicular plane of the string.

Figure 8:
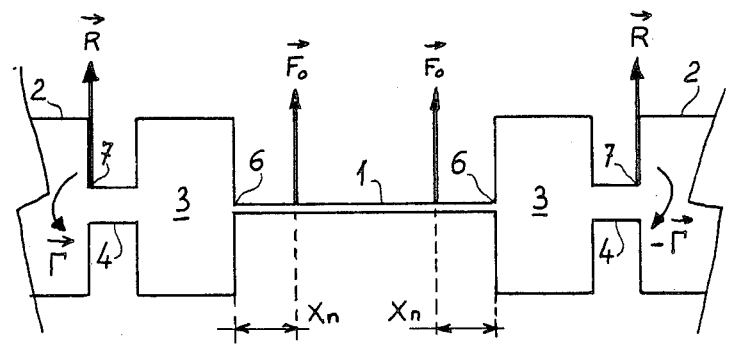
FIG. 8 illustrates in the case of even vibration mode operation of the resonator of FIGS. 5a and 6a, on the one hand the forces $\vec{Fo}$ exerted by the string, vibrating element and, on the other hand, the forces $\vec{R}$ and the moments of reaction $\vec{\Gamma}$ and $-\vec{\Gamma}$ exerted by the whole of the resonator at the level of the mounts 7 on the fixing elements 2.

The principle of the decoupling consists in judiciously defining the dimensions of masses 3 so as to cancel out, on the connection cross section 7, between articulation 4 and fixing means 2, the resultant R of the reaction of the support such as shown in FIG. 8. A non zero torque (moment) $\vec{\sigma}$ continues to exist, for the angular stiffness of the articulation 4 is not zero.

In practice, the moment $\vec{\sigma}$ may be made very small with respect to the product Fo.b, b being the length of masses 3 if the vibration frequency is large with respect to the resonance frequency in rotation of mass 3 about articulation 4.

Furthermore, for an even mode, the sum of the torques at the level of the sections is zero, which cancels out the torque of the forces applied to the structure between the two sections 7. Which is the case for the fundamental flexion mode of the string.

When the mass of an inertia mass is great with respect to the string mass, the optimum decoupling condition R=0 is expressed by the following approximate equation:

$$\frac{a^2 + b^2}{6(b + c)} = Xn + \frac{b}{2} \quad (5)$$

Figure 9A:
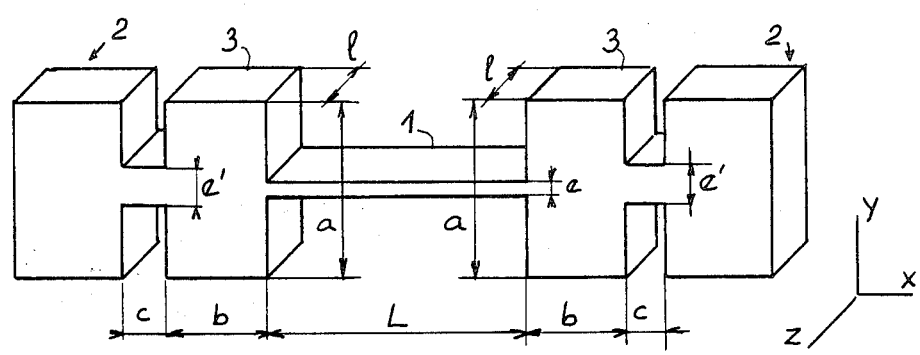
FIG 9a is a perspective view of the resonator of FIGS 5a and 6a in accordance with the invention, fixed by both ends.

Xn is the characteristic distance of the chosen mode n for a string embedded at both ends, as defined above and a being the dimension of the masses 3 orthogonally to their length, c being the length of articulation 4. The dimensions a, b, c are shown in FIG. 9 which illustrates the resonator, with the orientation of the crystallographic axes X, Y Z of the quartz from which it is cut.

The dimensions of the fixing elements 2 are of no importance.

In the case of inertia masses of any form and a string of evolutive section along its longitudinal axis, the optimum decoupling condition is expressed by the following practical equation:

$$\frac{J}{m \cdot Lg} = Nx + d \quad (6)$$

in which equation:
J represents the moment of inertia of the mass with respect to an axis passing through its center of gravity and perpendicular to the flexion plane,
m represents the mass df the inertia mass,
Lg represents the distance from the center of gravity of the mass to the axis of rotation of the mass,
d represents the distance between the center of gravity of the inertia mass and the embedment of the string.

Figure 9B:
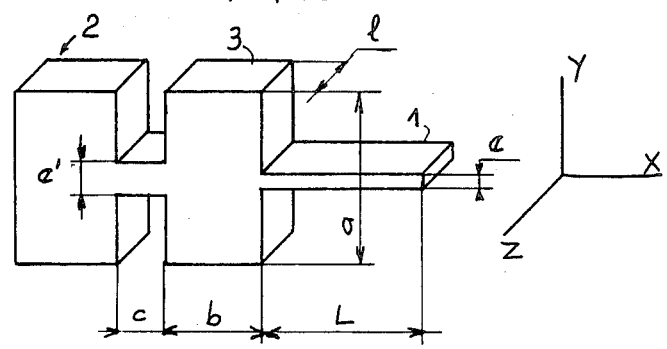
FIG. 9b is a view similar to FIG. 9a, the resonator being fixed by only one end, the other end being free.

In the case of a string embedded at only one end (FIGS. 5b and 9b), decoupling is obtained by a single mass 3 since the string is free at one end. Under these conditions, the optimum decoupling equation (5) is the same as before, Xn now corresponding to the mode n of a beam embedded at only one end. FIG. 9b shows an embodiment of a decoupled structure for the fundamental flexion mode of the string in plane X, Y. The resonance frequency is here obtained by piezoelectric effect, and is practically the same as for the preceding structure, taking into account the chosen dimensions.

The axes X, Y, Z represent the crystallographic axes of the block of quartz used.

In the two embodiments described and having here, for a one piece resonator cut out from a block or slab of quartz of uniform thickness advantageously by ultrasonic machining in a single operation using a single tool, having a frequency of the fundamental mode of the order of 50 KHZ in the absence of longitudinal stress, the coefficient of quality obtained currently exceeds the value of 100 000. This factor of quality in the case of the first example is maintained throughout a very extensive frequency range as a function of the longitudinal force applied to the resonator.

The resonator of the invention allows resonators to be economically constructed having a very good quality coefficient. It is particularly advantageous to use it as force sensor, pressure sensor, temperature sensor, as well as vibratory element for gyroscopic uses.

What is claimed is:
1. A resonator, comprising:
a beam capable of vibrating under flexion;
a pair of fixing means for fixing said beam at both of its ends;
a pair of inertia mass means disposed between said beam and respective ones of said fixing means for providing a vibratory decoupling between said beam and said pair of fixing means;
a pair of flexible articulation means disposed between and interconnecting respective ones of said inertia mass means and said fixing means;
a pair of flexible articulation means disposed between and interconnecting respective ones of said inertia mass means and said fixing means;
each inertia mass means being mounted to oscillate in a vibration plane in which said beam vibrates and to pivot about a pivot axis orthogonal to said vibration plane, said pivot axis being situated at one of said flexible articulation means;
each inertia mass being rigid, compact and having a convex contour and being connected at its face opposite to said beam to one of said flexible articulation means;
each inertia mass means being driven to rotate only about said pivot axis in response to vibration of said beam; and
the pair of inertia mass means having predetermined sizes to yield in said vibration plane a substantially zero resulting force applied to said pair of fixing means by said beam, said pair of inertia mass means and said pair of flexible articulation means.

2. A resonator, comprising:
a beam capable of vibrating under flexion and having one free end;
a fixing means for fixing said beam at its other end;
an inertia mass disposed between said fixing means and said beam for providing a vibratory decoupling between said beam and said fixing means;
a flexible articulation means disposed between and interconnecting said inertia mass and said fixing means;
said inertia mass being mounted to oscillate in a vibration plane of said beam and to pivot about a pivot axis orthogonal to said vibration plane, said pivot axis being situated at the flexible articulation means;
said inertia mass being rigid, compact and having a convex contour and being connected at its face opposite to said beam to said flexible articulation means;
said inertia mass being driven to pivot only about said pivot axis in response to vibration of said beam; and said inertia mass having a predetermined size to yield in said vibration plane a substantially zero resulting force applied to said fixing means by said beam, said inertia mass and said flexible articulation means.

3. The resonator as claimed in one of claims 1 or 2, wherein said inertia mass comprises at least two elementary masses connected together by a flexible element allowing rotation of each elementary mass in the vibration plane of said string.

4. The resonator as claimed in one of claims 1 or 2, wherein the natural resonance frequency of said inertia masses is higher than that of said vibrating string.

5. The resonator as claimed in one of claims 1 or 2, wherein said string is adapted for vibrating in a fundamental flexion mode.

6. The resonator as claimed in one of claims 1 or 2, wherein said string is adapted for vibrating in a partial flexion mode.

7. The resonator as claimed in one of claims 1 or 2, wherein, in the vibration plane of the string, said inertia masses have the form of a rectangle.

8. The resonator as claimed in one of claims 1 or 2, wherein, in the vibration plane of the string, said inertia masses have the form of an ellipse.

9. The resonator as claimed in one of claims 1 or 2, having a one piece structure and being cut out from a slab of material of uniform thickness.

10. The resonator as claimed in claim 9, wherein the material of uniform thickness is a quartz string kept on one of its resonance frequencies by piezoelectric effect.

11. The resonator as claimed in claim 10, obtained by ultrasonic machining in a single operation using a single tool.

* * * * *